(12) United States Patent
Nomiya

(10) Patent No.: US 7,691,469 B2
(45) Date of Patent: Apr. 6, 2010

(54) CERAMIC MULTILAYER SUBSTRATE AND METHOD FOR MANUFACTURING THE SAME

(75) Inventor: Masato Nomiya, Yasu (JP)

(73) Assignee: Murata Manufacturing Co., Ltd. (JP)

( * ) Notice: Subject to any disclaimer, the term of this patent is extended or adjusted under 35 U.S.C. 154(b) by 51 days.

(21) Appl. No.: 12/049,848

(22) Filed: Mar. 17, 2008

(65) Prior Publication Data

US 2008/0156413 A1 Jul. 3, 2008

Related U.S. Application Data

(63) Continuation of application No. PCT/JP2006/315927, filed on Aug. 11, 2006.

(30) Foreign Application Priority Data

Sep. 16, 2005 (JP) .............................. 2005-270703

(51) Int. Cl.
*B32B 9/00* (2006.01)

(52) U.S. Cl. .................. 428/210; 428/209; 428/212; 174/256; 174/258; 174/262; 174/264; 257/703

(58) Field of Classification Search ................ 428/210, 428/209, 212; 174/250–258, 262, 264; 257/703
See application file for complete search history.

(56) References Cited

U.S. PATENT DOCUMENTS

| 4,868,034 | A |   | 9/1989  | Steinberg |         |
|-----------|---|---|---------|-----------|---------|
| 5,130,280 | A | * | 7/1992  | Dupon et al. | 501/108 |
| 5,188,886 | A | * | 2/1993  | Dupon et al. | 428/209 |
| 5,830,563 | A | * | 11/1998 | Shimoto et al. | 428/209 |
| 6,432,239 | B1 |  | 8/2002  | Mandai et al. |       |
| 6,815,046 | B2 | * | 11/2004 | Mandai et al. | 428/210 |
| 2002/0157760 | A1 |  | 10/2002 | Mandai et al. |   |
| 2003/0211302 | A1 |  | 11/2003 | Mandai et al. |   |

FOREIGN PATENT DOCUMENTS

| EP | 1 033 749 A2 | 9/2000 |
| JP | 1220303 | 9/1989 |
| JP | 5242724 A | 9/1993 |
| JP | 6204512 | 7/1994 |
| JP | 9241862 | 9/1997 |
| JP | 10092226 | 4/1998 |
| JP | 10242644 | 9/1998 |
| JP | 2000315864 | 11/2000 |
| JP | 2002094244 | 3/2002 |

* cited by examiner

*Primary Examiner*—Cathy Lam
(74) *Attorney, Agent, or Firm*—Dickstein, Shapiro, LLP.

(57) ABSTRACT

A ceramic multilayer substrate exhibiting reduced pealing and breakage of an internal conductor disposed between a ceramic layer serving as a base member and a ceramic layer for restricting shrinkage includes a first ceramic layer 11, a second ceramic layer 12 laminated so as to come into contact with a principal surface of the first ceramic layer 11, and an internal conductor 13 disposed between the first ceramic layer 11 and the second ceramic layer 12, a phosphorus component layer 16a is disposed in the first ceramic layer 11 with a concentration gradient in which the concentration decreases in a direction away from the internal conductor 13.

9 Claims, 7 Drawing Sheets

CERAMIC MULTILAYER SUBSTRATE AND METHOD FOR MANUFACTURING THE SAME

This is a continuation of application Serial No. PCT/JP2006/315927, filed Aug. 11, 2006.

TECHNICAL FIELD

The present invention relates to a ceramic multilayer substrate to be used for a multi-chip module and the like and a method for manufacturing the same.

BACKGROUND ART

In recent years, the performance of electronic component in an electronics field has been improved significantly and, thereby, increases in information processing speed, miniaturization of apparatuses, and expansion in functionality of information processing equipment, e.g., large computers, mobile communication terminals, and personal computers, have been facilitated.

A multi-chip module (MCM), in which a plurality of semiconductor devices, e.g., VLSI and ULSI, mounted on a ceramic substrate, is mentioned as one of such electronic components. In such modules, ceramic multilayer substrates including three-dimensionally disposed wiring conductors are used frequently in order to increase the mounting density of semiconductor devices and electrically favorably connect between individual semiconductor devices. The ceramic multilayer substrate is a laminate composed of a plurality of ceramic layers, and the surface and the inside thereof include wiring conductors for constituting circuits.

Regarding production of the ceramic multilayer substrate, it is known that there is a technical problem during firing in restriction of shrinkage of unfired ceramic layers in a plane direction. In order to solve this problem, two types of unfired ceramic layers having different sintering temperatures are laminated and fired so as to restrict shrinkage of the unfired ceramic layers in a plane direction, thereby taking advantage of a difference in shrinkage behavior. The above-described method may be referred to as a "shrinkage-compensation process" or the like.

FIG. 12 is a rough sectional view showing a known ceramic multilayer substrate produced by using the shrinkage-compensation process. As shown in FIG. 12, a ceramic multilayer substrate 70 has a structure in which first ceramic layers 71 formed from a first ceramic material and second ceramic layers 72 formed from a second ceramic material having a sintering temperature higher than the first ceramic material are laminated. Internal conductors 73 are disposed between the first ceramic layers 71 and the second ceramic layers 72, and external conductors 74 are disposed on the surfaces of the ceramic multilayer substrate 70. The internal conductors 73 and the external conductors 74 are electrically connected to each other by via conductors 75 penetrating the first ceramic layers 71 and the second ceramic layers 72 in a thickness direction.

Regarding production of the ceramic multilayer substrate 70, second ceramic green layers serving as the second ceramic layers 72 after firing functions in such a way as to restrict shrinkage of the first ceramic green layers serving as the first ceramic layers after the firing. (Refer to, for example, Patent Document 1.)

Patent Document 1: Japanese Unexamined Patent Application Publication No. 2000-315864

DISCLOSURE OF INVENTION

Problems to be Solved by the Invention

Usually, the internal conductor 73 in the ceramic multilayer substrate 70 is formed by firing an electrically conductive paste film formed from an electrically conductive paste. In the firing step, the electrically conductive paste film also exhibits a shrinkage behavior and stress is applied from the second ceramic green layer in a direction of restriction of the shrinkage. On the other hand, the electrically conductive paste film is also in contact with the first ceramic green layer and, therefore, has also applied a shrinkage stress of the first ceramic green layer to it.

That is, the electrically conductive paste film has stresses applied in different directions from the first ceramic green layer and the second ceramic green layer. As a result, there is a problem in that pealing and breakage tends to occur in the internal conductors after firing.

The present invention is to solve the above-described problems. Accordingly, it is an object of the present invention to provide a ceramic multilayer substrate capable of reducing peeling and breakage of an internal conductor while the internal conductor is disposed between a ceramic layer serving as a base member and a ceramic layer for restricting shrinkage and a method for manufacturing the same.

Means for Solving the Problems

A ceramic multilayer substrate according to the present invention is characterized by including a first ceramic layer formed by sintering a first ceramic material, a second ceramic layer which is laminated so as to come into contact with a principal surface of the above-described first ceramic layer and which contains an unsintered second ceramic material having a sintering temperature higher than the sintering temperature of the above-described first ceramic material, and an internal conductor disposed between the above-described first ceramic layer and the above-described second ceramic layer, wherein the above-described unsintered second ceramic material is fixed by a part of the above-described first ceramic material which permeates from the above-described first ceramic layer into the above-described second ceramic layer, and the above-described first ceramic layer contains a phosphorus component with a concentration gradient in which the concentration decreases in a direction farther from the above-described internal conductor.

In the ceramic multilayer substrate according to the present invention, the above-described internal conductor may contain a phosphorus component. Furthermore, an external conductor may be disposed on an exposed surface of the above-described first ceramic layer or the above-described second ceramic layer, and a mounting component may be mounted on the above-described external conductor.

A method for manufacturing a ceramic multilayer substrate according to the present invention is characterized by including the steps of preparing a ceramic green laminate provided with a first ceramic green layer containing a first ceramic material, a second ceramic green layer which is laminated so as to come into contact with a principal surface of the above-described first ceramic green layer and which contains a second ceramic material having a sintering temperature higher than the sintering temperature of the above-described first ceramic material, and an electrically conductive paste film which is disposed between the above-described first ceramic green layer and the above-described second ceramic green layer and which contains phosphorus or a phosphorus compound, and firing the above-described ceramic green laminate at a temperature at which the above-described first ceramic material is sintered and at which the above-described second ceramic material is not sintered, wherein in the firing the above-described ceramic green laminate, a part of the above-described first ceramic material permeates from the above-described first ceramic green layer into the above-described second ceramic green layer, and the phosphorus component diffuses from the above-described electrically conductive paste film into the above-described first ceramic green layer and the above-described second ceramic green layer.

In the method for manufacturing a ceramic multilayer substrate according to the present invention, preferably, the above-described phosphorus compound is copper pyrophosphate.

Advantages

According to the present invention, the phosphorus component diffuses from the electrically conductive paste film side into the first ceramic green layer, and the phosphorus component functions in such a way as to restrict the shrinkage of the first ceramic green layer. Consequently, the shrinkage stress applied to the electrically conductive paste film by the first ceramic green layer can be relaxed. Therefore, a difference between the shrinkage stress applied by the first ceramic green layer and the shrinkage restriction stress applied by the second ceramic green layer to the electrically conductive paste film is reduced and, thereby, occurrence of peeling and breaking in the internal conductor after firing can be reduced.

The first ceramic green layer provided with the electrically conductive paste film may be warped into a concave shape depending on the composition of the electrically conductive paste film. (However, the warp hardly appears in practice because of the influence of the second ceramic green layer. In this case, the electrically conductive paste film is applied with a stress in such a way as to be peeled from the second ceramic green layer. As a result, peeling of the internal conductor may occur after firing. According to the present invention, since the phosphorus component is supplied to the first ceramic green layer, the shrinkage of the first ceramic green layer is restricted, so that warping of the first ceramic green layer can be reduced. In this manner, occurrence of peeling of the internal conductor after firing can be reduced.

Japanese Unexamined Patent Application Publication No. 10-242644 discloses that $P_2O_5$ is used as a substrate material for the ceramic multilayer substrate. However, addition of the phosphorus component throughout the substrate causes deterioration in the mechanical-electrical properties of the substrate. In the present invention, the phosphorus component is supplied with a concentration to a portion adjacent to the electrically conductive paste film on the first ceramic green layer. Therefore, deterioration in the properties of the substrate is minimized and, in addition, the internal conductor can be prevented from becoming defective.

Japanese Unexamined Patent Application Publication No. 2002-94244 discloses that a glass powder containing $P_2O_3$ is added to a constraint layer, that is, the second ceramic green layer in the present invention. However, the glass powder is added to the second ceramic green layer, and the glass component is difficult to diffuse or penetrate the electrically conductive paste film even if the glass component diffuses. Therefore, it is difficult to supply the phosphorus component to the portion adjacent to the electrically conductive paste film on the first ceramic green layer.

Japanese Unexamined Patent Application Publication No. 1-220303, Japanese Unexamined Patent Application Publication No. 6-204512, and Japanese Unexamined Patent Application Publication No. 9-241862 disclose that a phosphorus component is added to an electrically conductive paste. However, all of these publications relate to "post-fire" in which a conductor is baked on a fired substrate, and the prerequisites thereof are quite different from that of the present invention related to "co-fire", in which a substrate and an conductor are fired simultaneously, and related to a shrinkage-compensation process.

Furthermore, Japanese Unexamined Patent Application Publication No. 10-92226 discloses that a phosphoric acid ester serving as a surfactant is added to an electrically conductive paste for a monolithic ceramic capacitor. However, a ceramic multilayer substrate is required to have high transmission characteristics in a high frequency band, and it is necessary that an internal conductor having a small width, a large thickness, and a high aspect ratio is formed as compared with an internal conductor in the monolithic ceramic capacitor. Therefore, usually, addition of the phosphoric acid ester which decreases the viscosity of the electrically conductive paste is not favorable.

REFERENCE NUMERALS

| | |
|---|---|
| 10 | ceramic multilayer substrate |
| 11 | first ceramic layer |
| 12 | second ceramic layer |
| 13 | internal conductor |
| 14 | external conductor |

-continued

| | |
|---|---|
| 15 | via conductor |
| 16a, 16b | phosphorus component layer |
| 17 | mounting component |
| 20 | ceramic green laminate |
| 21 | first ceramic green layer |
| 22 | second ceramic green layer |
| 23 | electrically conductive paste film |
| 24, 25 | electrically conductive paste film |
| 30 | ceramic green laminate |
| 31 | first ceramic green layer |
| 32 | second ceramic green layer |
| 33 | electrically conductive paste film |
| 38 | composite green sheet |
| 38a, 38b | composite green sheet group |

BEST MODES FOR CARRYING OUT THE INVENTION

Figure 1:
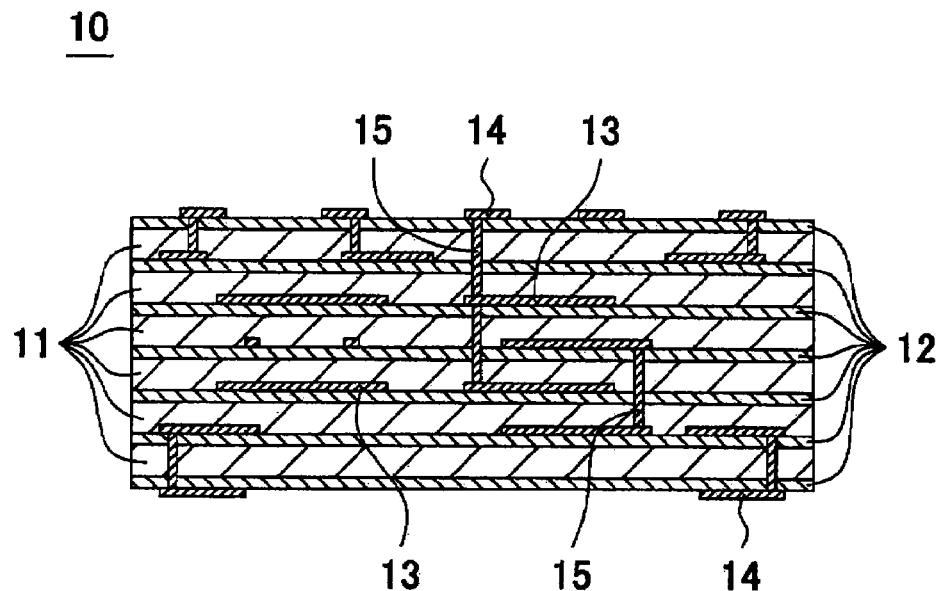
FIG. 1 is a sectional view showing an example of a ceramic multilayer substrate according to the present invention.
Figure 2:
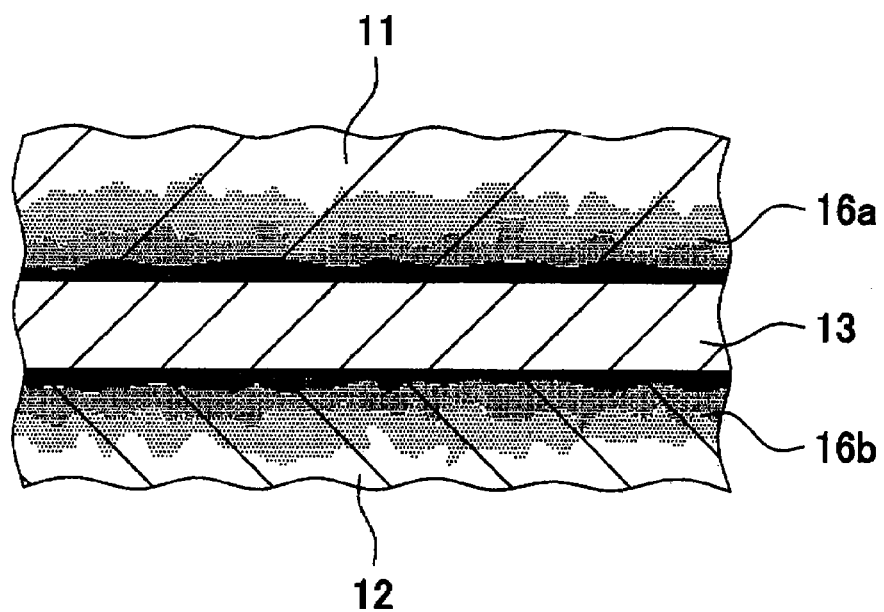
FIG. 2 is a sectional view schematically showing a magnified portion of the ceramic multilayer substrate shown in FIG. 1.
Figure 3:
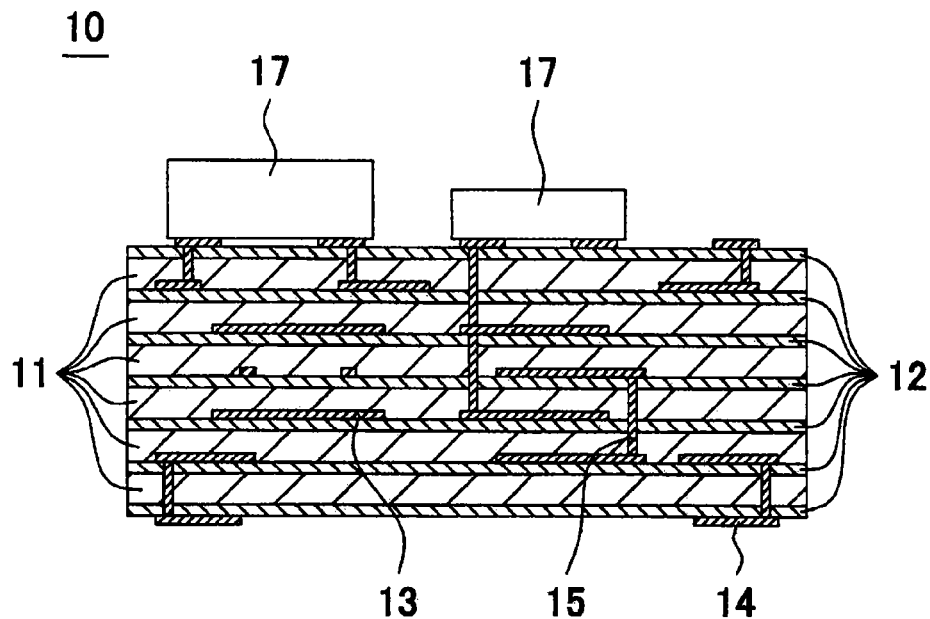
FIG. 3 is a sectional view showing a state in which a mounting component is mounted on the ceramic multilayer substrate shown in FIG. 1.

FIG. 1 is a sectional view showing an example of a ceramic multilayer substrate according to the present invention. FIG. 2 is a sectional view schematically showing a magnified portion of the ceramic multilayer substrate shown in FIG. 1. FIG. 3 is a sectional view showing a state in which a mounting component is mounted on the ceramic multilayer substrate shown in FIG. 1.

As shown in FIG. 1, a ceramic multilayer substrate 10 includes first ceramic layers 11, second ceramic layers 12 which are laminated so as to come into contact with principal surfaces of the first ceramic layers 11, and internal conductors 13 disposed between the first ceramic layers 1 and the second ceramic layers 12. External conductors 14 are disposed on the surfaces of the ceramic multilayer substrate 10. Via conductors 15 are disposed in such a way as to penetrate the first ceramic layers 11 and the second ceramic layers 12. The internal conductors 13 and the external conductors 14 are electrically conducted to each other through the via conductors 15.

The first ceramic layer 11 is formed by sintering a first ceramic material and controls the substrate properties of the ceramic multilayer substrate 10. Preferably, the thickness of the first ceramic layer 11 is 10 to 100 µm. All the thicknesses of individual first ceramic layers 11 are not necessarily the same.

A part (for example, a glass component) of the first ceramic material to be used permeates into the second ceramic layer 12 during the firing. Preferably, LTCC (Low Temperature Co-fired Ceramic) which can be fired at relatively low temperatures, for example, 100° C. or lower, is used as the first ceramic material in order that co-firing with a conductor formed from a low-melting point metal, e.g., silver or copper, can be conducted. Specifically, glass ceramic formed by mixing alumina and borosilicate glass, Ba—Al—Si—O ceramic which generates a glass component during firing, or the like can be used.

The second ceramic layer 12 contains an unsintered second ceramic material having a sintering temperature higher than the sintering temperature of the first ceramic material. The thickness of the second ceramic layer 12 is determined in consideration of the thickness of the first ceramic layer 11 and is preferably 1 to 10 µm.

The second ceramic material is fixed by a part of the first ceramic material which permeates from the first ceramic layer 11. Consequently, the second ceramic layer 12 is solidified and, in addition, the first ceramic layer 11 and the second ceramic layer 12 are joined to each other. Alumina or zirconia can be used as the second ceramic material.

As schematically shown in FIG. 2, the first ceramic layer 11 and the second ceramic layer 12 have phosphorus component layers 16a and 16b, respectively, each with a concentration gradient in which the concentration decreases in a direction away from the internal conductor 13. The above-described concentration gradient suggests that the phosphorus component has diffused from the internal conductor 13 side.

In the first ceramic layer 11 and the second ceramic layer 12, the phosphorus component may be present in a state of an oxide, e.g., $P_2O_5$. The phosphorus component may further diffuse across the first ceramic layer 11 and the second ceramic layer 12 into the adjacent ceramic layers.

Regarding the method for diffusing the phosphorus component from the internal conductor 13 side, as described later, a method in which phosphorus or a phosphorus compound is added to the electrically conductive paste film serving as the internal conductor 13 after firing is the simplest method. In this method, the phosphorus component may also remain in the internal conductor 13 depending on the conditions, e.g., the amount of phosphorus or the phosphorus compound, the thickness of the electrically conductive paste film, and the firing condition.

In the present embodiment, both the first ceramic layer 11 and the second ceramic layer 12 contain the phosphorus component. However, in consideration of the object of the present invention, it is enough that at least the first ceramic layer 11 contains the phosphorus component, and both of them do not necessarily contain the phosphorus component. For example, the phosphorus component is allowed to preferentially diffuse into the first ceramic layer 11 by applying a paste containing phosphorus or the phosphorus compound between the electrically conductive paste film and the first ceramic green layer serving as the first ceramic layer 11 after the firing.

The internal conductor 13 has a function of transmitting signals primarily in a substrate plane direction. The internal conductor 13 is desired to be small and have a low resistance as the ceramic multilayer substrate 10 is miniaturized and higher frequencies are used. In particular, in the case where transmission lines, e.g., strip lines and waveguides, are formed from the internal conductor 13, it is preferable that the internal conductor 13 is a conductor having a small width, a large thickness, and a high aspect ratio. Specifically, it is preferable that the width is 30 to 200 µm, and the thickness is 3 to 20 µm.

The external conductor 14 has the function of transmitting signals primarily in a substrate plane direction and a function as a land electrode to mount a mounting component. The via conductor 15 has the function of three-dimensionally connecting the internal conductors 13 and the external conductors 14 to each other. It is preferable that the diameter of the via conductor 15 is 50 to 200 µm.

For the internal conductor 13, the external conductor 14 and the via conductor 15, at least one type of metal selected from the group consisting of silver, gold, copper, nickel, silver-palladium alloy, and silver-platinum alloy can be used.

As shown in FIG. 3, mounting components 17 may be mounted on the external conductors 14. A soldering method or the like is used in the mounting. In FIG. 3, the external conductors 14 are disposed on exposed surfaces of the second ceramic layers 12. However, in the case where the first ceramic layer 11 is an uppermost layer, the external conductor 14 may be disposed on the exposed surface of the first ceramic layer 11.

Various types of mounting components 17 can be used in accordance with circuits to be disposed. For example, active elements, e.g., transistors, ICs, and LSIs, and passive elements, e.g., chip capacitors, chip resistances, chip thermistors, and chip inductors, can be used.

Figure 4:
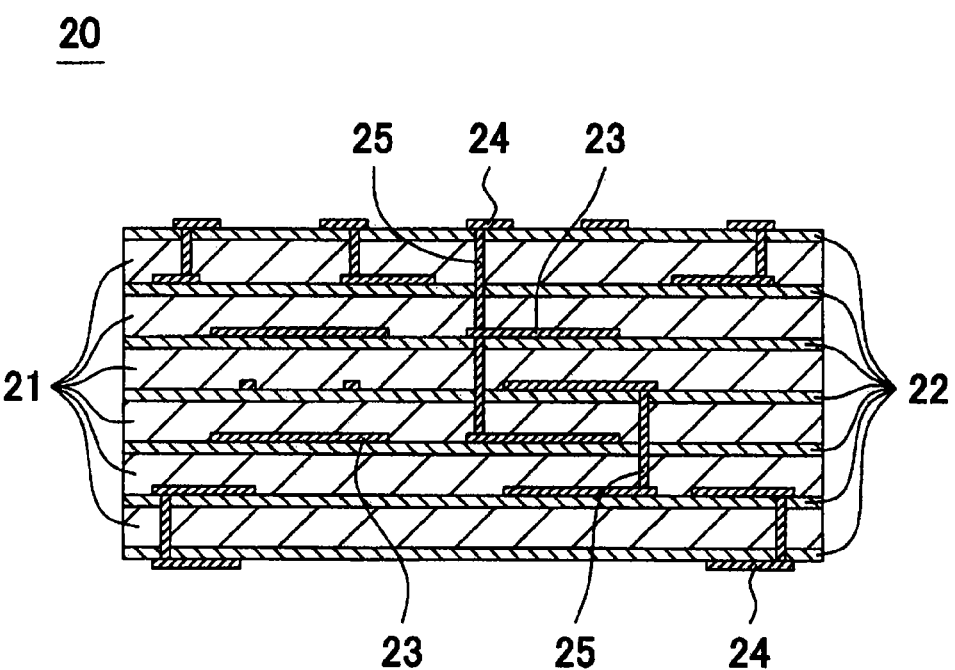
FIG. 4 is a sectional view showing an example of a ceramic green laminate in a method for manufacturing a ceramic multilayer substrate according to the present invention.

A method for manufacturing a ceramic multilayer substrate according to the present invention will be described. FIG. 4 is a sectional view showing an example of a ceramic green laminate to be prepared for producing the ceramic multilayer substrate.

As shown in FIG. 4, a ceramic green laminate 20 includes first ceramic green layers 21, second ceramic green layers 22 which are laminated so as to come into contact with principal surfaces of the first ceramic green layers 21, and electrically conductive paste films 23 for internal conductor disposed between the first ceramic green layers 21 and the second ceramic layers 22. Electrically conductive paste films 24 for external conductors are disposed on the surfaces of the ceramic green laminate 20. Via holes are disposed in the first ceramic green layers 21 and the second ceramic green layers 22. An electrically conductive paste 25 for via conductors is filled in the via holes.

The first ceramic green layer 21 contains a first ceramic material, and the second ceramic green layer 22 contains a second ceramic material having a sintering temperature higher than the sintering temperature of the first ceramic material. The first ceramic material and the second ceramic material are as described above and further explanations thereof will not be provided.

The first ceramic green layer 21 and the second ceramic green layer 22 are formed by using, for example, a ceramic slurry. The ceramic slurry is a mixture of raw materials, for example, a ceramic powder, a binder, a solvent and a plasticizer. For the ceramic powder, the first ceramic material or the second ceramic material can be used. For the binder, an organic binder, e.g., an acrylic resin, a methacrylic resin and polyvinyl butyral, can be used. For the solvent, an organic solvent, e.g., toluene, isopropylene alcohol, and other alcohols, can be used. For the plasticizer, di-n-butyl phthalate and the like can be used.

Examples of methods for forming the ceramic green laminate 20 from the ceramic slurry include a sheet method in which ceramic green sheets are produced by molding the ceramic slurry into the shape of a sheet and are laminated. Alternatively, a sequential lamination method can also be used wherein the spraying of the ceramic slurry on a resin film or a ceramic green sheet serving as a base member, immersion, or printing is repeated so as to build up individual ceramic green layers. The sheet method is superior in efficiency. However, the second ceramic green layer 22 is usually very thin and handleability is poor when single-sheet molding is conducted. Therefore, it can be said that a method in which a ceramic green sheet is produced by integrating the first ceramic green layer 21 and the second ceramic green layer 22 and the resulting sheets are laminated, is particularly preferable.

The electrically conductive paste film 23 is formed from an electrically conductive paste containing an electrically conductive powder, phosphorus or a phosphorus compound, a solvent and a binder.

A metal powder can be used as the electrically conductive powder. For example, at least one type of metal selected from the group consisting of silver, gold, copper, nickel, silver-palladium alloy, and silver-platinum alloy can be used. Preferably, a powder having an average particle diameter of 0.1 to 10 μm is used as the electrically conductive powder. Preferably, the content of the metal powder in the electrically conductive paste is 60 to 90 percent by weight.

A simple substance of phosphorus exists as a solid at ambient temperature. The phosphorus compound can exist as a solid or a liquid at ambient temperature. However, addition of a liquid becomes a factor responsible for reduction of the viscosity of the electrically conductive paste, and it becomes difficult to form a conductor having a high aspect ratio. Therefore, it is preferable that a solid is used as the phosphorus compound. It is preferable that a powder having an average particle diameter of 0.5 to 5.0 μm is used as phosphorus or a solid phosphorus compound.

A phosphorus compound which is decomposed during firing so as to liberate the phosphorus component is selected. In the case where no phosphorus component is liberated, diffusion of the phosphorus component does not occur during the firing, and shrinkage of the first ceramic green layer 21 is not restricted. Therefore, a phosphorus compound having a decomposition temperature lower than the firing temperature of the ceramic green laminate 20 is selected. For example, in the case where the firing temperature is about 1,000° C., copper pyrophosphate and phosphoric acid are decomposed, whereas silver phosphate and calcium phosphate are not decomposed.

Preferably, the phosphorus compound contains a metal of the same type as the electrically conductive powder. For example, in the case where copper is used as the electrically conductive powder and copper pyrophosphate is used as the phosphorus compound, since copper pyrophosphate is decomposed into a copper component and a phosphorus component, the copper component integrates with copper of the electrically conductive powder. Consequently, the electrical conductivity can be maintained favorably.

Phosphorus or the phosphorus compound may be added separately from the electrically conductive powder or be added while being adhered to the electrically conductive powder in such a way as to cover the surface of the electrically conductive powder. In the latter case, production may be conducted by, for example, heating and agitating a copper powder in a sodium pyrophosphate aqueous solution, followed by washing and drying.

Preferably, the content of phosphorus or the phosphorus compound in the electrically conductive paste is 0.01 to 0.5 percent by weight in terms of phosphorus. Furthermore, in the case where, for example, copper pyrophosphate is used as the phosphorus compound, preferably, the content of copper pyrophosphate in the electrically conductive paste is 0.1 to 5.0 percent by weight. If the content of copper pyrophosphate is less than 0.1 percent by weight, shrinkage of the first ceramic green layer 21 may not be restricted satisfactorily. On the other hand, if the content exceeds 5.0 percent by weight, the amount of diffusion of the phosphorus component from the electrically conductive paste may become too large, and the volume of the electrically conductive paste may become too small, so that the electrically conductive paste may shrink excessively.

For the solvent included in the electrically conductive paste, terpineol, isopropylene alcohol or other alcohols, and the like can be used. Preferably, the content of the solvent in the electrically conductive paste is 8 to 33 percent by weight.

For the binder included in the electrically conductive paste, an acrylic resin, an alkyd resin, a butyral resin, ethyl cellulose and the like, can be used. Preferably, the content of the binder in the electrically conductive paste is 0.5 to 7.0 percent by weight.

A glass powder and a ceramic powder of the same type as the ceramic powder included in the first ceramic green layer 21 may be added to the electrically conductive paste in addition to the above-described components. However, it is preferable that the amount of addition of these components are small. Furthermore, it is particularly preferable that these components are excluded. The reason for this is that the glass powder becomes a factor responsible for reduction in electrical conductivity of the conductor and occurrence of deterioration in properties due to a reaction with the substrate component, and the ceramic powder becomes a factor responsible for reduction in electrical conductivity of the conductor.

The electrically conductive paste film 24 and the electrically conductive paste film 25 are formed from an electrically conductive paste containing an electrically conductive powder, a solvent and a binder. For the electrically conductive powder, the solvent and the binder, the same substances as those for the electrically conductive paste film 23 can be used.

The electrically conductive paste films 23 and 24 are formed by printing the electrically conductive paste on a ceramic green sheet with a printing device, e.g., by screen printing. The electrically conductive paste 25 for the via conductor is formed by, for example, making a through hole in the ceramic green sheet and filling the through hole with the electrically conductive paste.

The resulting ceramic green laminate 20 is fired at a temperature at which the first ceramic material is sintered, but the second ceramic material is not sintered. Consequently, the second ceramic green layer 22 performs the function of restricting shrinkage of the first ceramic green layer 21 when the first ceramic green layer 21 begins to shrink. In this manner, a ceramic multilayer substrate with high dimensional accuracy can be produced.

The atmosphere of the firing is appropriately adjusted in accordance with the type of first ceramic material and the type of electrically conductive powder contained in the electrically conductive paste film.

In the firing step, the firing conditions, e.g., the temperature and the time, are adjusted in such a way that the first ceramic material permeates from the first ceramic green layer 21 into the second ceramic green layer 22 and, in addition, the phosphorus component diffuses from the electrically conductive paste film 23 into the first ceramic green layer 21.

In the present invention, regarding various powders, an "average particle diameter" refers to an average particle diameter measured with MICROTRAC HRA (produced by SHIMADZU CORPORATION) after a powder is dispersed sufficiently in a dispersion medium by using an ultrasonic dispersion device.

EXPERIMENTAL EXAMPLE 1

A Ba—Al—Si—O ceramic powder serving as a ceramic powder, toluene and a mixture of alcohols sold under the trademark EKINEN serving as a solvent, a butyral resin binder serving as a binder, and DOP (bis-2-ethylhexyl phthalate) serving as a plasticizer were prepared, and they were mixed so as to produce a ceramic slurry. The resulting ceramic slurry was molded into the shape of a sheet so as to produce a ceramic green sheet of 15.0 mm length, 15.0 mm width and 37 µm thickness.

An alumina powder, a B—Si—Ba glass powder, EKINEN serving as a solvent, a butyral resin binder serving as a binder, and DOP serving as a plasticizer were prepared, and they were mixed so as to produce a ceramic slurry. The resulting ceramic slurry was applied to the above-described ceramic green sheet, so as to produce a composite green sheet, in which a second ceramic green layer was formed on a first ceramic green layer, having a thickness of 40 µm was produced.

An electrically conductive paste was produced by mixing components in the proportion of 80 percent by weight of copper powder having an average particle diameter of 2 µm, a predetermined amount of copper pyrophosphate powder having an average particle diameter of 1 µm, 18 percent by weight of terpineol serving as a solvent, and 2 percent by weight of ethyl cellulose serving as a binder. The content of copper pyrophosphate powder was as shown in Table 1.

The electrically conductive paste was printed on one composite green sheet in such a way that the thickness becomes 5 µm. A plurality of composite green sheets with no electrically conductive paste printed were laminated on the top and bottom of the resulting sheet. The resulting laminate was cut so as to produce a ceramic green laminate of 1 cm length, 1 cm width and 0.6 mm thickness.

Figure 5:
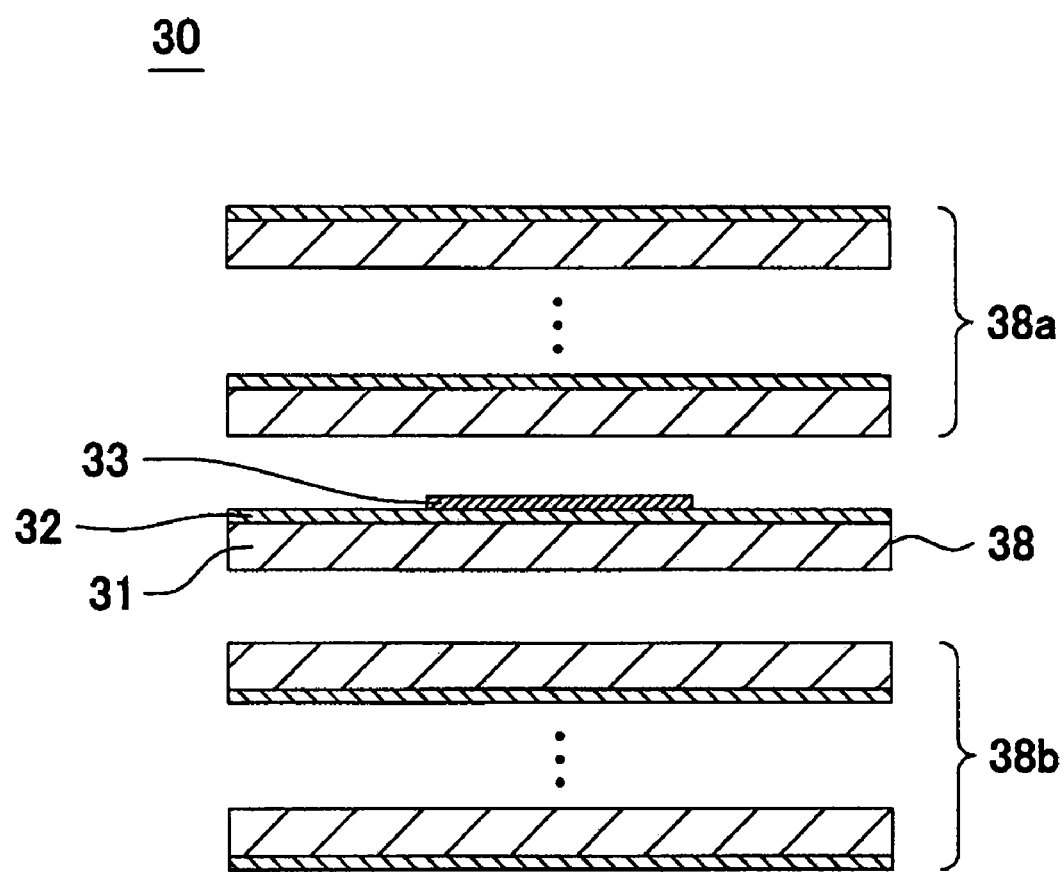
FIG. 5 is a sectional view showing a lamination state of a ceramic green laminate in Experimental example 1.

FIG. 5 is an exploded sectional view showing a lamination state of the ceramic green laminate in the present experimental example. As shown in FIG. 5, the composite green sheet 38 in a ceramic green laminate 30 is composed of a first ceramic green layer 31 and a second ceramic green layer 32 formed on the first ceramic green layer 31. In the composite green sheet 38, an electrically conductive paste film 33 is formed on the second ceramic green layer 32. The electrically conductive paste film 33 is formed as a meander line (i.e., a pattern having a meander shape) having a line width of 100 µm and line width:line length of 1:400.

Composite green sheet groups 38a and 38b provided with no electrically conductive film 33 are disposed on the top and bottom of the composite green sheet 38. The composite green sheet group 38a is disposed with the first ceramic green layer 31 down, and the composite green sheet group 38b is disposed with the first ceramic green layer 31 up in this drawing. In the present experimental example, the composite green sheets constituting the composite green sheet groups 38a and 38b had 14 sheet layers and 15 sheet layers, respectively.

One hundred (100) units of the above-described ceramic green laminates were produced. Each ceramic green laminate was fired under at a maximum temperature of 980° C. for 1 hour in a reducing atmosphere. In this manner, Samples 1 to 7 of the ceramic multilayer substrate shown in Table 1 were produced.

In a manner similar to that in Samples 1 to 7 except that the lamination pattern of the green sheets was changed, 100 units of each of Samples 8 and 9 of the ceramic multilayer substrate were produced.

Figure 6:
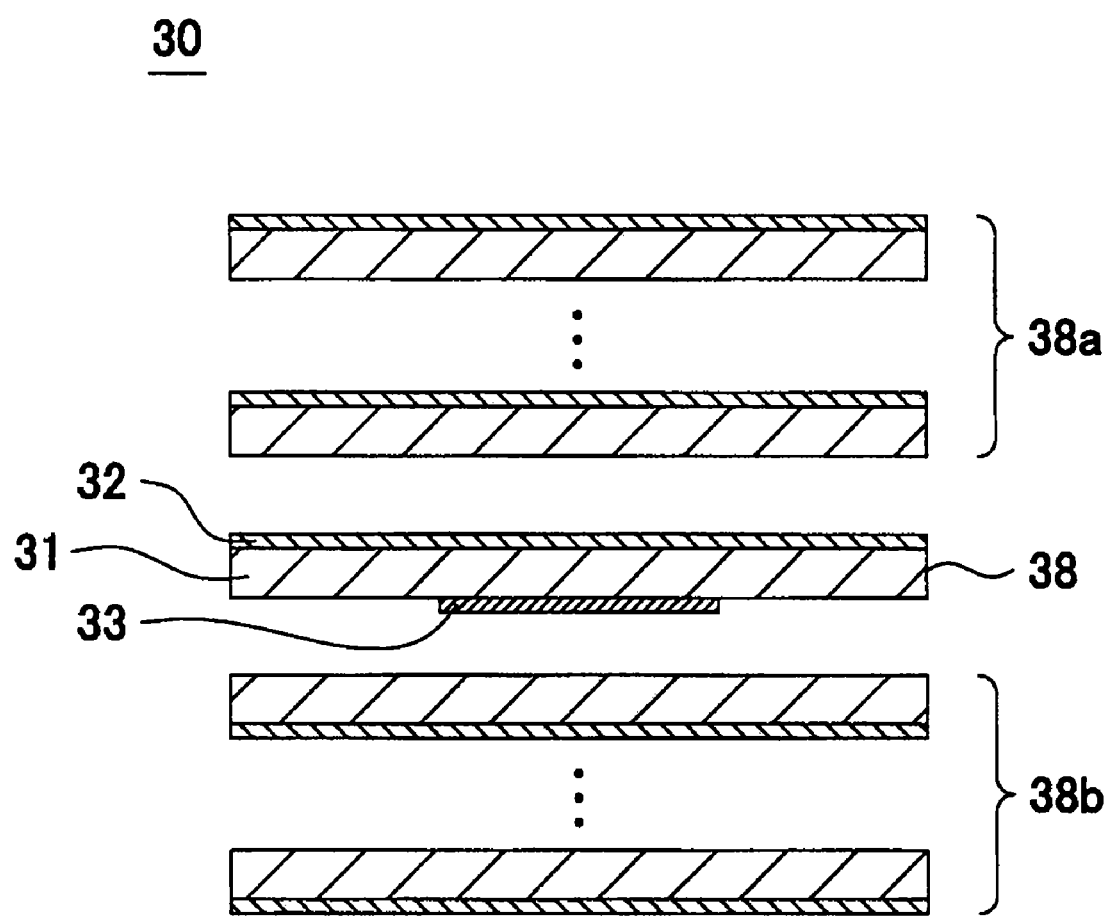
FIG. 6 is a sectional view showing a lamination state of a ceramic green laminate of Sample 8 in Experimental example 1.

In Sample 8, the electrically conductive paste film 33 was formed on the first ceramic green layer 31 in the composite green sheet 38 shown in FIG. 5. That is, as shown in FIG. 6, the electrically conductive paste film 33 was formed between two first ceramic green layers 31.

Figure 7:
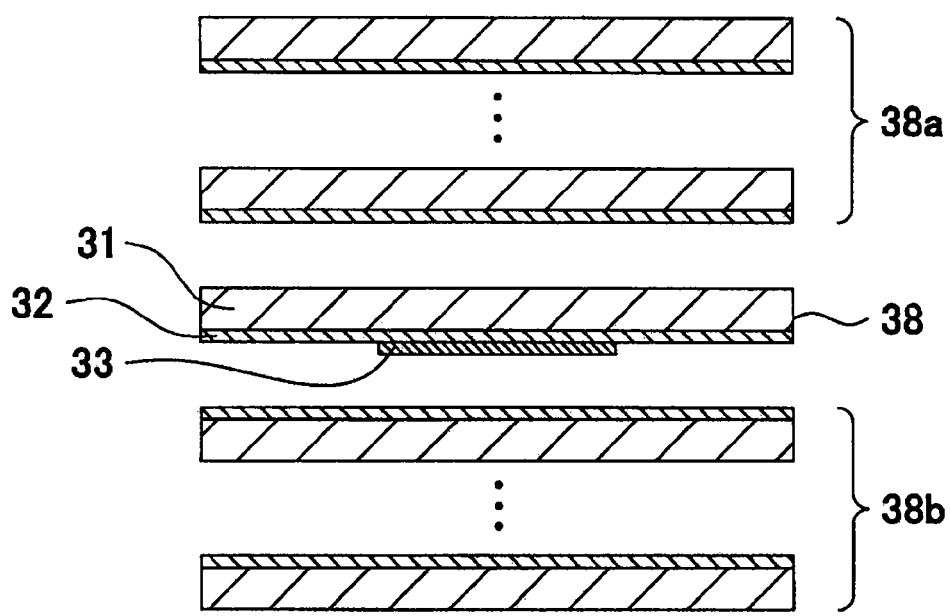
FIG. 7 is a sectional view showing a lamination state of a ceramic green laminate of Sample 9 in Experimental example 1.

In Sample 9, the composite green sheet 38 and the composite green sheet groups 38a and 38b were disposed in such a way that each of them in FIG. 5 was turned upside down. That is, as shown in FIG. 7, the electrically conductive paste film 33 was formed between two second ceramic green layers 32.

In each sample of the ceramic multilayer substrate, a cross-section of the substrate was polished. Thereafter, the cross section was observed with SEM (scanning electron microscope) to examine the state of the internal conductor. The state of peeling of an electrode was also ascertained with C-SAM (C mode scanning acoustic microscope). For each sample, the number of occurrences of peeling of the internal conductor and the number of occurrences of break of the internal conductor were determined. The results are shown in Table 1.

TABLE 1

| | Content of copper pyrophosphate in electrically conductive paste (percent by weight) | Position of formation of electrically conductive paste film | Number of occurrences of peeling | Number of occurrences of breakage |
|---|---|---|---|---|
| 1 | 0.1 | between first ceramic green layer and second ceramic green layer | 0/100 | 0/100 |
| 2 | 0.5 | between first ceramic green layer and second ceramic green layer | 0/100 | 0/100 |
| 3 | 1.0 | between first ceramic green layer and second ceramic green layer | 0/100 | 0/100 |
| 4 | 3.0 | between first ceramic green layer and second ceramic green layer | 1/100 | 0/100 |
| 5 | 5.0 | between first ceramic green layer and second ceramic green layer | 4/100 | 3/100 |
| 6 | 10.0 | between first ceramic green layer and second ceramic green layer | 18/100 | 5/100 |
| *7 | — | between first ceramic green layer and second ceramic green layer | 26/100 | 6/100 |
| *8 | — | between first ceramic green layer and first ceramic green layer | 0/100 | 0/100 |
| *9 | — | between second ceramic green layer and second ceramic green layer | 0/100 | 0/100 |

Asterisked sample numbers indicate samples which are out of Claims of the present invention.

In Samples 1 to 6, the occurrence of peeling and occurrence of breakage of the internal conductor were lower than those of Sample 7. It is estimated that the content of the phosphorus component in the electrically conductive paste was large in Sample 6, so that a large amount of phosphorus component in the electrically conductive paste diffused to the substrate side during the firing and, thereby, the electrically conductive paste became likely to shrink excessively so as to easily cause breakage and peeling of the internal conductor.

In Sample 8 and Sample 9, peeling and breaking of the internal conductor hardly occurred. From this, it is clear that in the case where the electrically conductive paste film is formed between the same type of ceramic green layers, the electrically conductive paste film is not applied with stresses in different directions and, therefore, peeling and breakage of the internal conductor do not become a problem essentially. As described above, the present invention is to solve the problems which occur for the first time in the situation where an electrically conductive paste film is formed between ceramic green layers of different types. The formation of the electrically conductive paste film between ceramic green layers of different types has significance in consideration of the flexibility in the circuit design and the lamination pattern. Therefore, the present invention makes a meaningful contribution.

EXPERIMENTAL EXAMPLE 2

This experiment is intended to show that the phosphorus component has the function of restricting shrinkage of the ceramic green layer.

A ceramic green sheet containing a Ba—Al—Si—O ceramic powder was produced as in Experimental example 1.

A test paste including components in the proportion of 90 percent by weight of copper pyrophosphate, 1 percent by weight of ethyl cellulose serving as a binder, and 9 percent by weight of terpineol serving as a solvent was produced. The resulting test paste was applied all over one principal surface of the ceramic green sheet in such a way that the thickness became 10 µm, and firing was conducted under the conditions of a maximum temperature of 980° C. for 1 hour in a reducing atmosphere. The resulting substrate is called the first test substrate. A ceramic green sheet without the test paste, was fired under the same heat treatment condition as that of the first test substrate and called the second test substrate.

Figure 8:
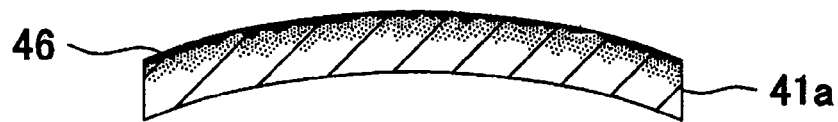
FIG. 8 is a sectional view showing a first test substrate in Experimental example 2.

FIG. 8 is a sectional view showing the first test substrate. In the first test substrate 41$a$, which was green, a white layer 46 was formed on the upper surface side. The first test substrate 41$a$ was warped in such a way that the upper surface side protruded, the upper surface being provided with the white layer 46. This white layer 46 was subjected to mapping analysis with WDX (wavelength dispersive X-ray spectrometer). As a result, a phosphorus component was detected with a concentration distribution in which the concentration decreased from the substrate upper surface side toward the inside of the substrate. This indicates that the phosphorus component diffused to the upper surface side of the first test substrate 41$a$ and, thereby, shrinkage of the upper surface side in the substrate plane direction was restricted as compared with that of the lower surface side.

Figure 9:
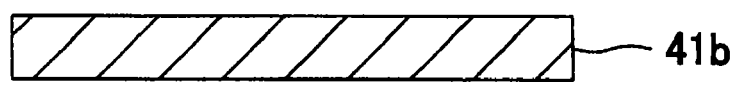
FIG. 9 is a sectional view showing a second test substrate in Experimental example 2.

FIG. 9 is a sectional view showing the second test substrate. The second test substrate 41$b$ was fired into a flat shape. This indicates that the degree of shrinkage of the upper surface side and the lower surface side of the second test substrate 41$b$ in the substrate plane direction were equal.

Consequently, as is clear from comparisons between the first test substrate 41$a$ and the second test substrate 41$b$, shrinkage of the substrate is partly restricted by diffusion of the phosphorus component from one principal surface of the substrate.

EXPERIMENTAL EXAMPLE 3

This experiment is intended to show that the phosphorus component in the electrically conductive paste film has a function of restricting warp of the ceramic green layer.

A composite green sheet, in which a second ceramic green layer was formed on a first ceramic green layer, having a thickness of 40 μm was produced as in Experimental example 1.

An electrically conductive paste was produced as in Experimental example 1. The content of the copper pyrophosphate powder was as shown in Table 2.

The electrically conductive paste was printed on one first ceramic green layer in such a way that the thickness became 5 μm. A plurality of composite green sheets with no electrically conductive paste printed were laminated thereunder, and the first ceramic green layer with no electrically conductive paste printed was laminated thereunder. The resulting laminate was cut so as to produce a ceramic green laminate of 1 cm length, 1 cm width, and 0.36 mm thickness.

Figure 10:
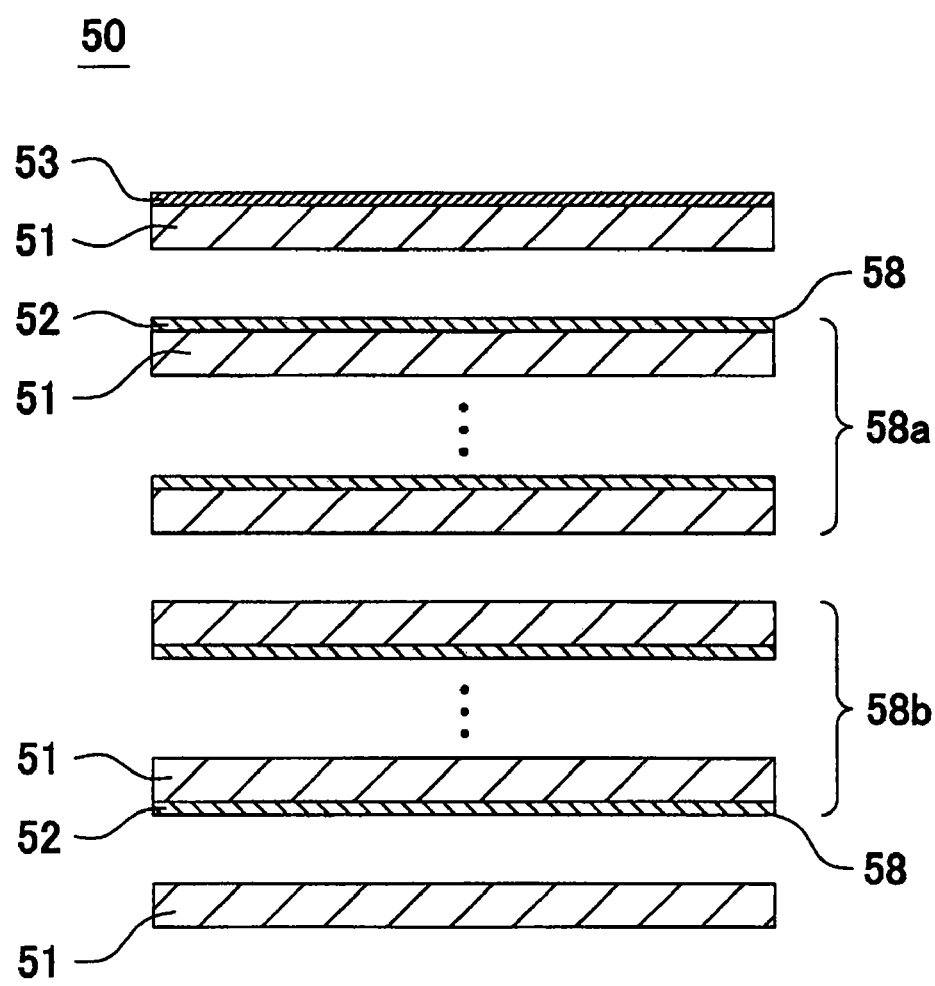
FIG. 10 is a exploded sectional view showing a lamination state of a ceramic green laminate in Experimental example 3.

FIG. 10 is an exploded sectional view showing a lamination state of the ceramic green laminate in the present experimental example. As shown in FIG. 10, a ceramic green laminate 50 includes the first ceramic green layers 51 disposed as the uppermost layer and the lowermost layer and the composite green sheet groups 58a and 58b disposed therebetween. An electrically conductive paste film 53 having a thickness of 10 μm is formed all over the surface of the uppermost first ceramic green layer 51. The composite green sheet 58 is composed of the first ceramic green layer 51 and the second ceramic green layer 52 formed on the first ceramic green layer 51. The composite green sheet group 58a is disposed with the first ceramic green layer 51 down, and the composite green sheet group 58b is disposed with the first ceramic green layer 51 up. In the present experimental example, the composite green sheets constituting each of the composite green sheet groups 38a and 38b were 7 sheets.

In the present experimental example, the electrically conductive paste film is not formed between the first ceramic green layer and the second ceramic green layer, and the electrically conductive paste film is exposed. This is an expedience for the sake of understanding the phenomenon of warp which occurs in the first ceramic green layer.

Regarding each electrically conductive paste, 10 units of the above-described ceramic green laminates were produced. Each ceramic green laminate was fired under the same conditions as that in Experimental example 1. In this manner, Samples 11 to 17 of the ceramic multilayer substrate shown in Table 2 were produced.

In a manner similar to that in Samples 11 to 17 except that no electrically conductive paste film was formed, 10 units of Sample 18 of the ceramic multilayer substrate were produced.

Figure 11:
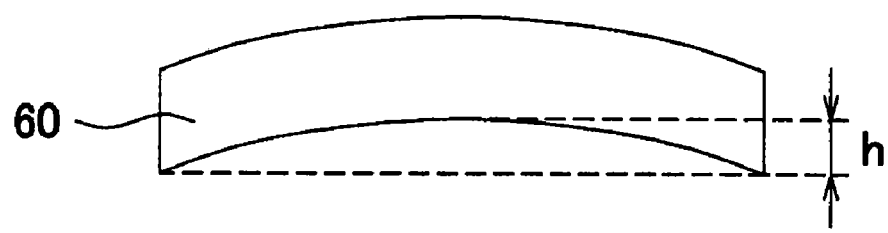
FIG. 11 is a side view schematically showing a state of warp of a ceramic multilayer substrate in Experimental example 3.
Figure 12:
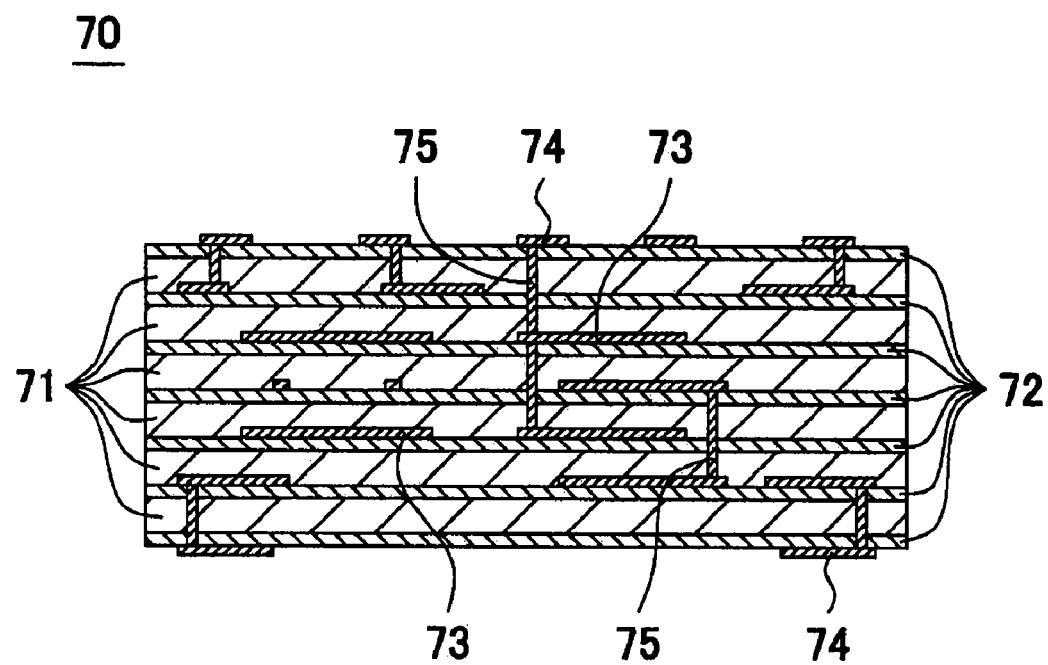
FIG. 12 is a sectional view showing a known ceramic multilayer substrate.

For each sample of the ceramic multilayer substrate, warp of the substrate was examined on the basis of the shape of the substrate side surface. FIG. 11 is a side view schematically showing the state of warp of the ceramic multilayer substrate. As shown in FIG. 11, the amount of deformation of substrate is represented by a distance h between a midpoint of the bottom surface of a ceramic multilayer substrate 60 and a midpoint of a virtual straight line joining lower ends of two end surfaces of the substrate. For each sample, the distance h was measured with a micro gauge, and an average value thereof was determined. The results are shown in Table 2. A positive value of this distance indicates that the substrate is warped into a convex shape, i.e. in such a way that the upper principal surface is protruded.

TABLE 2

| | Content of copper pyrophosphate in electrically conductive paste (percent by weight) | Amount of deformation of substrate (μm) | Remarks |
|---|---|---|---|
| 11 | 0.1 | 4.8 | |
| 12 | 0.5 | 2.3 | |
| 13 | 1.0 | 0.2 | |
| 14 | 3.0 | −0.07 | |
| 15 | 5.0 | −4.5 | |
| 16 | 10.0 | −6.85 | |
| *17 | — | −11.6 | |
| *18 | — | 6.8 | No electrically conductive paste film was formed |

Asterisked sample numbers indicate samples which are out of Claims of the present invention.

As is clear from Table 2, the warp of Sample 18 in which no electrically conductive paste film was formed, was 6.8 μm, whereas the magnitude of warp of Sample 17, in which an electrically conductive paste film not containing copper pyrophosphate was formed, was −11.6 μm and, therefore, it was ascertained that the substrate was warped in a concave shape. Consequently, it is clear that the stress, which warps the substrate into the concave shape, occurred by forming the electrically conductive paste film.

This stress is due to facilitation of shrinkage of the first ceramic green layer based on the formation of the electrically conductive paste film. In the case where the electrically conductive paste film is formed between the first ceramic green layer and the second ceramic green layer, this stress performs a function of peeling the electrically conductive paste film from the second ceramic green layer so as to cause peeling of the internal conductor after the firing.

This warp does not easily clearly appear in the case where the electrically conductive paste film is formed between the first ceramic green layer and the second ceramic green layer. This is because the second ceramic green layer is hardly deformed and, therefore, it seems that no warp occurs as a whole. However, even in the case where the second ceramic green layer is formed, there is no change in that the electrically conductive paste film is applied with a stress due to the tendency of the first ceramic green layer to warp.

As is clear from Table 2, where the amount of addition of copper pyrophosphate is within a predetermined range (for example, 0.1 percent by weight (Sample 11) to 1.0 percent by weight (Sample 13), the warp of the substrate is gradually corrected as the amount of addition of copper pyrophosphate increases. That is, when copper pyrophosphate is added to the electrically conductive paste, the phosphorus component diffuses into the first ceramic green layer, shrinkage of the first ceramic green layer is partly restricted and, thereby, the stress for warping the substrate into a concave shape is relaxed. However, it is clear that if the amount of addition of copper pyrophosphate exceeds the predetermined range (for example, exceeds 3.0 percent by weight (Sample 14)), warp occurs in a reverse direction.

Therefore, under a given condition, the magnitude and direction of warp can be controlled by adjusting the amount of addition of copper pyrophosphate.

INDUSTRIAL APPLICABILITY

According to the present invention, it becomes possible to restrict occurrences of peeling and breakage of the internal conductor during the firing step in production of the ceramic multilayer substrate. Consequently, it becomes possible to provide a highly reliable ceramic multilayer substrate.

Therefore, the present invention can be widely applied to uses, for example, a multi-chip module (MCM) having a structure, in which semiconductor devices, e.g., VLSI and ULSI, are mounted on a ceramic substrate.

The invention claimed is:

1. A ceramic multilayer substrate characterized by comprising a sintered laminate containing:
    a first ceramic layer of a first ceramic material and having a principal surface;
    a second ceramic layer laminated so as to be in contact with the principal surface of the first ceramic layer and which contains a second ceramic material which has a sintering temperature higher than the sintering temperature of the first ceramic material; and
    an internal conductor disposed between the first ceramic layer and the second ceramic layer,
    wherein a part of the first ceramic material has permeated from the first ceramic layer into the second ceramic layer, and
    the first ceramic layer contains a phosphorus component with a concentration gradient in which the phosphorus concentration is greatest at a point nearest the internal conductor and then the concentration decreases in a direction away from the internal conductor.

2. The ceramic multilayer substrate according to claim 1, characterized in that the thicknesses of the first and second ceramic layers are 10-100 µm and 1-10 µm respectively and the thickness of the internal conductor is 3-20 µm.

3. The ceramic multilayer substrate according to claim 1, characterized in that there are a plurality of internal conductors disposed in the substrate, and a pair of said internal conductors sandwich a ceramic layer containing a via electrically connecting the pair of internal conductors.

4. A ceramic multilayer substrate characterized by comprising a sintered laminate containing:
    a first ceramic layer of a first ceramic material and having a principal surface;
    a second ceramic layer laminated so as to be in contact with the principal surface of the first ceramic layer and which contains a second ceramic material which has a sintering temperature higher than the sintering temperature of the first ceramic material; and
    an internal conductor which comprises a phosphorus component disposed between the first ceramic layer and the second ceramic layer,
    wherein a part of the first ceramic material has permeated from the first ceramic layer into the second ceramic layer, and
    the first ceramic layer contains a phosphorus component with a concentration gradient in which the phosphorus concentration is greatest at a point nearest the internal conductor and then the concentration decreases in a direction away from the internal conductor.

5. The ceramic multilayer substrate according to claim 4, characterized in that at least one of the first and second ceramic layers has an exposed surface, an external conductor is disposed on an exposed surface of at least one of the first ceramic layer and second ceramic layer, and an electronic component is mounted on the external conductor.

6. The ceramic multilayer substrate according to claim 5, characterized in that the thicknesses of the first and second ceramic layers are 10-100 µm and 1-10 µm respectively and the thickness of the internal conductor is 3-20 µm.

7. The ceramic multilayer substrate according to claim 6, characterized in that the second ceramic layer contains the phosphorus component with a concentration gradient in which the concentration decreases in a direction away from the internal conductor.

8. The ceramic multilayer substrate according to claim 7, characterized in that there are a plurality of internal conductors disposed in the substrate, and a pair of said internal conductors sandwich a ceramic layer containing a via electrically connecting the pair of internal conductors.

9. A ceramic multilayer substrate characterized by comprising a sintered laminate containing:
    a first ceramic layer of a first ceramic material and having a principal surface;
    a second ceramic layer laminated so as to be in contact with the principal surface of the first ceramic layer and which contains a second ceramic material which has a sintering temperature higher than the sintering temperature of the first ceramic material; and
    an internal conductor disposed between the first ceramic layer and the second ceramic layer,
    wherein a part of the first ceramic material has permeated from the first ceramic layer into the second ceramic layer, and
    the first ceramic layer contains a phosphorus component with a concentration gradient in which the phosphorus concentration is greatest at a point nearest the internal conductor and then the concentration decreases in a direction away from the internal conductor, and
    wherein the second ceramic layer contains the phosphorus component with a concentration gradient in which the concentration decreases in a direction away from the internal conductor.

* * * * *